United States Patent
Xu et al.

(10) Patent No.: US 12,181,753 B2
(45) Date of Patent: Dec. 31, 2024

(54) PIXEL STRUCTURE AND DISPLAY PANEL INCLUDING THE SAME

(71) Applicant: TCL CHINA STAR OPTOELECTRONICS TECHNOLOGY CO., LTD., Guangdong (CN)

(72) Inventors: Yue Xu, Guangdong (CN); Yani Chen, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 606 days.

(21) Appl. No.: 17/419,791

(22) PCT Filed: May 28, 2021

(86) PCT No.: PCT/CN2021/096617
§ 371 (c)(1),
(2) Date: Jun. 30, 2021

(87) PCT Pub. No.: WO2022/227173
PCT Pub. Date: Nov. 3, 2022

(65) Prior Publication Data
US 2022/0357623 A1  Nov. 10, 2022

(30) Foreign Application Priority Data
Apr. 25, 2021 (CN) .......................... 202110448585.3

(51) Int. Cl.
*G02F 1/1343* (2006.01)
*G02F 1/1337* (2006.01)
(Continued)

(52) U.S. Cl.
CPC .................. *G02F 1/134354* (2021.01); *G02F 1/136286* (2013.01); *G02F 1/1368* (2013.01);
(Continued)

(58) Field of Classification Search
CPC ......... G02F 1/134354; G02F 1/136286; G02F 1/1368; G02F 1/133761; G02F 1/134309; H01L 27/124
See application file for complete search history.

(56) References Cited

U.S. PATENT DOCUMENTS 11,092,858 B2 * 8/2021 Li ........................... G02F 1/137
2015/0168751 A1 * 6/2015 Lee ..................... G02F 1/13624
349/33

(Continued)

FOREIGN PATENT DOCUMENTS

CN 102707520 A 10/2012
CN 105785675 A 7/2016
(Continued)

*Primary Examiner* — David Vu
*Assistant Examiner* — Brandon C Fox
(74) *Attorney, Agent, or Firm* — Rivka Friedman

(57) ABSTRACT

The present application provides a pixel structure and a display panel. Each of a plurality of sub-pixel units includes a main sub-pixel, at least one secondary sub-pixel, and a thin film transistor electrically connecting the main sub-pixel and the at least one secondary sub-pixel, wherein by controlling a pretilt angle of a first branch electrode of the main sub-pixel to be different from a pretilt angle of a second branch electrode of the secondary sub-pixel, a driving voltage of the main sub-pixel and a driving voltage of the secondary sub-pixel are different, so that color shift can be effectively alleviated and wider viewing angles can be obtained, thus being beneficial to improve an aperture ratio and light transmission of the pixel structure.

17 Claims, 4 Drawing Sheets

(51) Int. Cl.
*G02F 1/1362* (2006.01)
*G02F 1/1368* (2006.01)
*H01L 27/12* (2006.01)

(52) U.S. Cl.
CPC ...... *H01L 27/124* (2013.01); *G02F 1/133761* (2021.01); *G02F 1/134309* (2013.01)

(56) References Cited

U.S. PATENT DOCUMENTS

| | | | | |
|---|---|---|---|---|
| 2016/0238915 | A1* | 8/2016 | Kim | G09G 3/3648 |
| 2019/0139987 | A1 | 5/2019 | Gan | |
| 2019/0317373 | A1* | 10/2019 | Kang | G02F 1/136259 |
| 2021/0225301 | A1* | 7/2021 | Yang | G09G 3/3607 |

FOREIGN PATENT DOCUMENTS

| | | | |
|---|---|---|---|
| CN | 107272272 A | 10/2017 | |
| CN | 107589602 A | 1/2018 | |
| CN | 111474789 A | 7/2020 | |
| CN | 111679516 A | 9/2020 | |
| CN | 112327544 A | 2/2021 | |

\* cited by examiner

PIXEL STRUCTURE AND DISPLAY PANEL INCLUDING THE SAME

BACKGROUND OF INVENTION

Field of Invention

The present application relates to the field of display technology, and in particular to a pixel structure and a display panel.

Description of Prior Art

For vertical alignment (VA) liquid crystal display panels, due to a large difference in birefringence of liquid crystal molecules at different viewing angles, the display panels will have color shifts at large viewing angles. In particular, large-sized vertical alignment liquid crystal display panels have color shifts at a vertical viewing angle.

At present, in order to solve the color shift problem, 3T_8 domain and 3T_12 domain vertical-alignment pixel designs are generally used to achieve a purpose of alleviating the color shift by making rotation angles of the liquid crystal molecules different between a main area and a sub-area in a same sub-pixel. However, whether in the 3T_12 domain pixel design or the 3T_8domain pixel design, multiple transistors are required for operation, which greatly reduces an aperture ratio and transmittance of a pixel structure.

In summary, there is an urgent need to provide a pixel structure and a display panel to solve the above technical problems.

SUMMARY OF INVENTION

The present application provides a pixel structure and a display panel to solve a technical problem of the existing pixel structure that multiple transistors are required for operation while overcoming a color shift defect, thereby greatly reducing an aperture ratio and transmittance of the pixel structure.

In order to solve the above problems, the technical solutions provided by the present application are as follows:

The present application provides a pixel structure. The pixel structure includes a plurality of scan lines and a plurality of data lines crossing each other, wherein the plurality of scan lines and the plurality of data lines define a plurality of sub-pixel units, each of the plurality of sub-pixel units includes a main sub-pixel, at least one secondary sub-pixel, and a thin film transistor electrically connecting the main sub-pixel and the at least one secondary sub-pixel;

wherein the main sub-pixel includes a main pixel electrode, the main pixel electrode includes a first trunk electrode and a first branch electrode, and the first branch electrode is electrically connected to the first trunk electrode at a first predetermined angle;

wherein each of the secondary sub-pixel includes a sub-pixel electrode, the sub-pixel electrode includes a second trunk electrode and a second branch electrode, and the second branch electrode is electrically connected to the second trunk electrode at a second predetermined angle; and wherein the first predetermined angle is different from the second predetermined angle, the first predetermined angle is greater than the second predetermined angle, and each of the first predetermined angle and the second predetermined angle ranges from 30 degrees to 50 degrees.

According to the pixel structure provided by the present application, the second predetermined angle between the second branch electrode and a corresponding one of second trunk electrode in different secondary sub-pixels is different.

According to the pixel structure provided by the present application, the second predetermined angle between the second branch electrode and a corresponding one of the second trunk electrode of the secondary sub-pixel disposed close to the main sub-pixel is β1, and the second predetermined angle between the second branch electrode and the corresponding one of the second trunk electrode of the secondary sub-pixel disposed away from the main sub-pixel is β2; and wherein β1 is greater than β2.

According to the pixel structure provided by the present application, the first predetermined angle ranges from 40 degrees to 50 degrees, and the second predetermined angle ranges from 30 degrees to 45 degrees.

According to the pixel structure provided by the present application, a control terminal of the thin film transistor is electrically connected to a corresponding one of the plurality of scan lines, a first terminal of the thin film transistor is electrically connected to a corresponding one of the plurality of data lines, and a second terminal of the thin film transistor is electrically connected to the main pixel electrode and the sub-pixel electrode.

According to the pixel structure provided by the present application, the main sub-pixel further includes a first storage capacitor and a first liquid crystal capacitor, and each of the secondary sub-pixel further includes a second storage capacitor and a second liquid crystal capacitor; and wherein the pixel structure further includes a first common electrode and a second common electrode; the first storage capacitor and the second storage capacitor are electrically connected to the first common electrode; the first liquid crystal capacitor is electrically connected to the second common electrode; and the first liquid crystal capacitor is electrically connected to the second common electrode.

According to the pixel structure provided by the present application, the at least one secondary sub-pixel includes a first secondary sub-pixel and a second secondary sub-pixel; the thin film transistor is electrically connected to the main sub-pixel, the first secondary sub-pixel, and the second secondary sub-pixel; and the thin film transistor is located between the first secondary sub-pixel and the second secondary sub-pixel; and wherein the first predetermined angle is greater than the second predetermined angle, and the second predetermined angle between the second branch electrode and a corresponding one of the second trunk electrode of the first secondary sub-pixel is greater than the second predetermined angle between the second branch electrode and a corresponding one of the second trunk electrode of the second secondary sub-pixel.

According to the pixel structure provided by the present application, the first predetermined angle ranges from 40 degrees to 50 degrees, the second predetermined angle between the second branch electrode and the corresponding one of the second trunk electrode of the first secondary sub-pixel ranges from 30 degrees to 40 degrees, and the second predetermined angle between the second branch electrode and the corresponding one of the second trunk electrode of the second secondary sub-pixel ranges from 35 degrees to 45 degrees.

The present application provides a pixel structure. The pixel structure includes a plurality of scan lines and a plurality of data lines arranged in an intersecting manner. The plurality of scan lines and the plurality of data lines define a plurality of sub-pixel units. The sub-pixel unit includes a main sub-pixel, at least one secondary sub-pixel, and a thin film transistor electrically connected to the main sub-pixel and at least one of the secondary sub-pixels;

The main sub-pixel includes a main pixel electrode, the main pixel electrode includes a plurality of scan lines and a plurality of data lines crossing each other, wherein the plurality of scan lines and the plurality of data lines define a plurality of sub-pixel units, each of the plurality of sub-pixel units includes a main sub-pixel, at least one secondary sub-pixel, and a thin film transistor electrically connecting the main sub-pixel and the at least one secondary sub-pixel;

wherein the main sub-pixel includes a main pixel electrode, the main pixel electrode includes a first trunk electrode and a first branch electrode, and the first branch electrode is electrically connected to the first trunk electrode at a first predetermined angle;

wherein each of the secondary sub-pixel includes a sub-pixel electrode, the sub-pixel electrode includes a second trunk electrode and a second branch electrode, and the second branch electrode is electrically connected to the second trunk electrode at a second predetermined angle; and wherein the first predetermined angle is different from the second predetermined angle.

According to the pixel structure provided in the present application, the second predetermined angle between the second branch electrode and a corresponding one of second trunk electrode in different secondary sub-pixels is different.

According to the pixel structure provided in the present application, the second predetermined angle between the second branch electrode and a corresponding one of the second trunk electrode of the secondary sub-pixel disposed close to the main sub-pixel is β1, and the second predetermined angle between the second branch electrode and the corresponding one of the second trunk electrode of the secondary sub-pixel disposed away from the main sub-pixel is β2; and wherein β1 is greater than β2.

According to the pixel structure provided in the present application, each of the first predetermined angle and the second predetermined angle ranges from 30 degrees to 50 degrees.

According to the pixel structure provided in the present application, the first predetermined angle is greater than the second predetermined angle.

According to the pixel structure provided in the present application, the first predetermined angle ranges from 40 degrees to 50 degrees, and the second predetermined angle ranges from 30 degrees to 45 degrees.

According to the pixel structure provided in the present application, a control terminal of the thin film transistor is electrically connected to a corresponding one of the plurality of scan lines, a first terminal of the thin film transistor is electrically connected to a corresponding one of the plurality of data lines, and a second terminal of the thin film transistor is electrically connected to the main pixel electrode and the sub-pixel electrode.

According to the pixel structure provided in the present application, the main sub-pixel further includes a first storage capacitor and a first liquid crystal capacitor, and each of the secondary sub-pixel further includes a second storage capacitor and a second liquid crystal capacitor; and wherein the pixel structure further includes a first common electrode and a second common electrode; the first storage capacitor and the second storage capacitor are electrically connected to the first common electrode; the first liquid crystal capacitor is electrically connected to the second common electrode; and the first liquid crystal capacitor is electrically connected to the second common electrode.

According to the pixel structure provided in the present application, the at least one secondary sub-pixel includes a first secondary sub-pixel and a second secondary sub-pixel; the thin film transistor is electrically connected to the main sub-pixel, the first secondary sub-pixel, and the second secondary sub-pixel; and the thin film transistor is located between the first secondary sub-pixel and the second secondary sub-pixel; and wherein the first predetermined angle is greater than the second predetermined angle, and the second predetermined angle between the second branch electrode and a corresponding one of the second trunk electrode of the first secondary sub-pixel is greater than the second predetermined angle between the second branch electrode and a corresponding one of the second trunk electrode of the second secondary sub-pixel.

According to the pixel structure provided in the present application, the first predetermined angle ranges from 40 degrees to 50 degrees, the second predetermined angle between the second branch electrode and the corresponding one of the second trunk electrode of the first secondary sub-pixel ranges from 30 degrees to 40 degrees, and the second predetermined angle between the second branch electrode and the corresponding one of the second trunk electrode of the second secondary sub-pixel ranges from 35 degrees to 45 degrees.

According to the pixel structure provided in the present application, the main sub-pixel further includes a third trunk electrode intersecting the first trunk electrode, and each of the secondary sub-pixel further includes a fourth trunk electrode intersecting the second trunk electrode; and wherein the first trunk electrode and the third trunk electrode divide the main sub-pixel into four liquid crystal alignment areas, and the second trunk electrode and the fourth trunk electrode divide each of the secondary sub-pixel into four liquid crystal alignment areas.

An embodiment of the present application provides a display panel including the above-mentioned pixel structure.

Beneficial effects of the present application are that: in the pixel structure and the display panel provided by the present application, by only disposing one thin film transistor to electrically connect a main sub-pixel and at least one secondary sub-pixel, and by controlling a pretilt angle of the first branch electrode of the main sub-pixel to be different from a pretilt angle of the second branch electrodes of the secondary sub-pixel, a driving voltage of the main sub-pixel and a driving voltage of the secondary sub-pixel are different, so that color shift can be effectively alleviated and wider viewing angles can be obtained. Compared with the prior art, the present application only needs to use one thin film transistor to drive the main sub-pixel and at least one sub-sub pixel, which reduces a number of thin film transistors, greatly saves space, and is beneficial to improve an aperture ratio and light transmission of the pixel structure, thus reducing power consumption.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
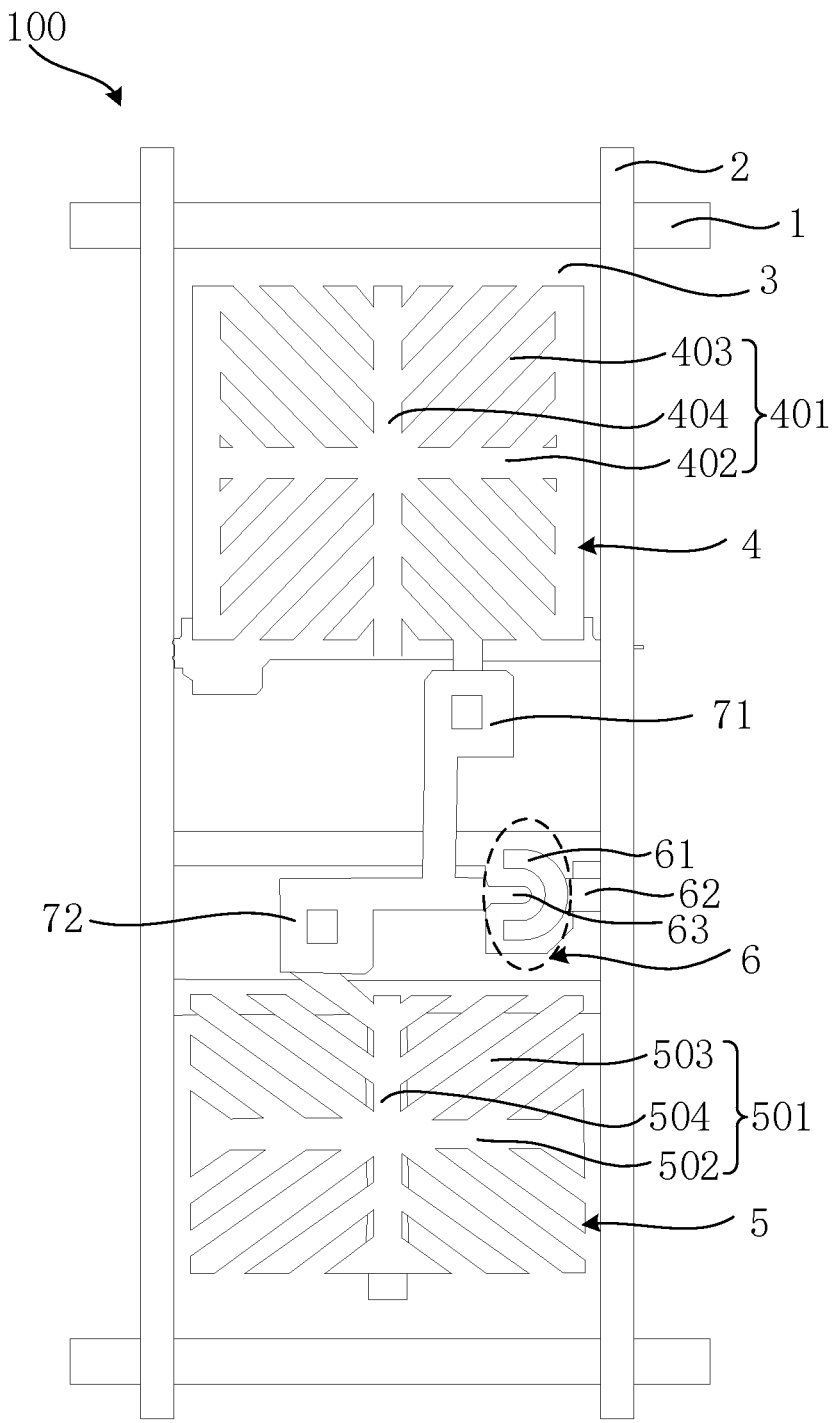
FIG. 1 is a schematic diagram of a plan structure of a first pixel structure provided by an embodiment of the present application.

Elements in the drawings are designated by reference numerals listed below.

100. pixel structure;
1. scanning line; 2. data line; 3. sub-pixel unit; 4. main sub-pixel; 5. secondary sub-pixel; 6. thin film transistor;
401. main pixel electrode; 402. first trunk electrode; 403. first branch electrode; 404. third trunk electrode; 405. side electrode;
501. sub-pixel electrode; 502. second trunk electrode; 503. second branch electrode;
504. fourth trunk electrode;
51. first secondary sub-pixel; 52. second secondary sub-pixel;
61. control terminal; 62. first terminal; 63. second terminal;
71. first via hole; 72. second via hole; 73. third via hole

DETAILED DESCRIPTION OF PREFERRED EMBODIMENTS

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the drawings, structurally similar elements are denoted by the same reference numerals.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be appreciated that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Referring to FIG. 1. FIG. 1 is a schematic diagram of a plan structure of a first pixel structure according to an embodiment of the present application. An embodiment of the present application provides a pixel structure 100. The pixel structure 100 includes a plurality of scan lines 1 and a plurality of data lines 2 crossing each other, and the plurality of scan lines 1 and the plurality of data lines 2 define a plurality of sub-pixel units 3. Each of the sub-pixel units 3 includes a main sub-pixel 4, at least one secondary sub-pixel 5, and a thin film transistor 6 electrically connected to the main sub-pixel 4 and at least one of the secondary sub-pixels 5.

The main sub-pixel 4 includes a main pixel electrode 401, the main pixel electrode 401 includes a first trunk electrode 402 and a first branch electrode 403, and the first branch electrode 403 is electrically connected to the first trunk electrode 402 at a first predetermined angle α. Each of the secondary sub-pixels 5 includes a sub-pixel electrode 501, the sub-pixel electrode 501 includes a second trunk electrode 502 and a second branch electrode 503, the second trunk electrode 502 and the first trunk electrode 402 are disposed in parallel with each other, and the second branch electrode 503 is electrically connected to the second trunk electrode 502 at a second predetermined angle β.

In the present application, by setting the first predetermined angle α to be different from the second predetermined angle β, a difference between deflection angles of liquid crystal molecules corresponding to the main sub-pixel 4 and the secondary sub-pixel 5 is controlled, and a driving voltage of the main sub-pixel 4 is different from a driving voltage of the secondary sub-pixel 5, so that the color shift of the display panel is alleviated, and large viewing angles are obtained. Compared with the prior art method in which two or more thin film transistors are provided to drive the main sub-pixel 4 and the secondary sub-pixel 5 to obtain a voltage difference, the present application only needs to use one thin-film transistor 6 to drive the main sub-pixel 4 and the secondary sub-pixels 5, thereby reducing a number of thin film transistors 6, which can greatly save space, thus being beneficial to improve an aperture ratio and light transmittance of the pixel structure 100, and reduce power consumption.

The technical solution of the present application will now be described in conjunction with specific embodiments.

Figure 2:
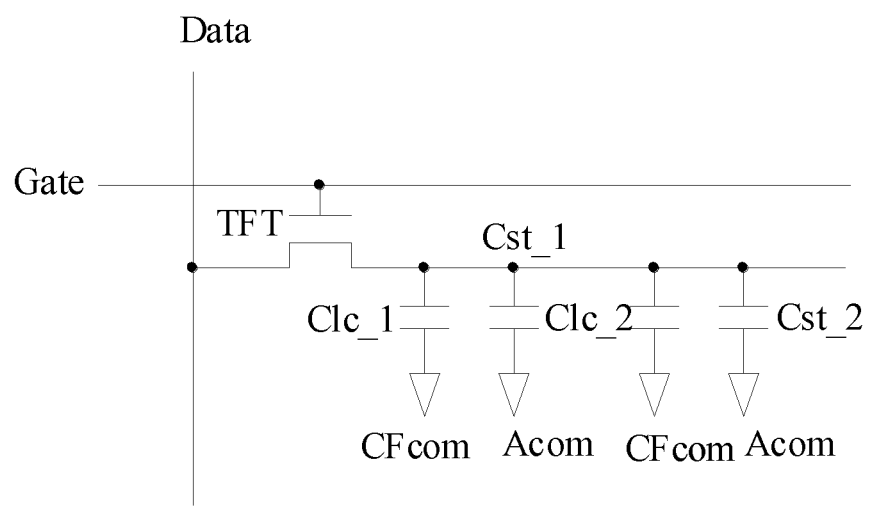
FIG. 2 is a circuit diagram corresponding to a pixel structure shown in FIG. 1.

Referring to FIG. 1 in conjunction with FIG. 2, the sub-pixel unit 3 of the pixel structure 100 in an embodiment of the present application may adopt an eight-domain pixel design. Specifically, each of the sub-pixel units 3 includes a main sub-pixel 4, a secondary sub-pixel 5, and a thin film transistor 6 electrically connected to the main sub-pixel 4 and the secondary sub-pixel 5.

The main sub-pixel 4 includes a main pixel electrode 401, the main pixel electrode 401 includes a first trunk electrode 402 and a first branch electrode 403, and the first branch electrode 403 is electrically connected to the first trunk electrode 402 at a first predetermined angle α. The secondary sub-pixel 5 includes a sub-pixel electrode 501, the sub-pixel electrode 501 includes a second trunk electrode 502 and a second branch electrode 503, the second trunk electrode 502 is parallel to the first trunk electrode 402, and the second branch electrode 503 is electrically connected to the second trunk electrode 502 at a second predetermined angle β. The first trunk electrode 402 and the second trunk electrode 502 are both lateral trunk electrodes.

In an embodiment of the present application, an area of the main sub-pixel 4 is larger than an area of the secondary sub-pixel 5, the thin film transistor 6 is provided between the main sub-pixel 4 and the secondary sub-pixel 5, and a control terminal 61 of the thin film transistor 6 is electrically connected to a corresponding one of the scan lines 1, a first terminal 62 of the thin film transistor 6 is electrically connected to a corresponding one of the data lines 2, and a second terminal 63 of the thin film transistor 6 is electrically connected to the main pixel electrode 401 and the sub-pixel electrode 501. Specifically, the second terminal 63 of the thin film transistor 6 is electrically connected to the main pixel electrode 401 through a first via hole 71, and the second terminal 63 of the thin film transistor 6 is electrically connected to the sub-pixel electrode 501 through a second via hole 72.

The control terminal 61 may be a gate of the thin film transistor 6, the first terminal 62 may be a source of the thin film transistor 6, and the second terminal 63 may be a drain of the thin film transistor 6. The thin film transistor 6 may be a P-type thin film transistor or an N-type thin film transistor, which is not particularly limited in embodiments of the present application.

The main sub-pixel 4 further includes a first storage capacitor Cst_1 and a first liquid crystal capacitor Clc_1, the secondary sub-pixel 5 further includes a second storage capacitor Cst_2 and a second liquid crystal capacitor Clc_2; the pixel structure 100 further includes a first common electrode Acom and a second common electrode CFcom, the first storage capacitor Cst_1 and the second storage capacitor Cst_2 are electrically connected to the first common electrode Acom, and the first liquid crystal capacitor Clc_1 and the second liquid crystal capacitor Clc_2 are electrically connected to the second common electrode CFcom.

It can be appreciated that, because the thin film transistor 6 is electrically connected to the main pixel electrode 401 and the sub pixel electrode 501 at the same time, the main sub-pixel 4 and the secondary sub-pixel 5 are charged and discharged by the same thin film transistor 6, that is, the charging and discharging conditions of the main sub-pixel 4 and the secondary sub-pixel 5 are completely the same, and the driving voltage of the main sub-pixel 4 is the same as the driving voltage of the secondary sub-pixel 5. In embodiments of the present application, by controlling a difference between the first predetermined angle α and the second predetermined angle β to control a difference in the deflection angles between the liquid crystal molecules corresponding to the main sub-pixel 4 and the liquid crystal molecules corresponding to the secondary sub-pixel 5, the color shift of the display panel can be alleviated and large viewing angles can be obtained.

Specifically, each of the first predetermined angle α and the second predetermined angle β ranges from 30 degrees to 50 degrees.

Further, since the main sub-pixel 4 is mainly used to control the brightness of the sub-pixel unit 3, the brightness of the main sub-pixel 4 is greater than the brightness of the secondary sub-pixel 5, and because the brightness of the main sub-pixel 4 and the brightness of the secondary sub-pixel 5 depends on the size of the first predetermined angle α and the second predetermined angle β, respectively, in an embodiment of the present application, by setting the first predetermined angle α to be greater than the second predetermined angle β, a deflection angle of the liquid crystal molecules corresponding to the main sub-pixel 4 is greater than a deflection angle of the liquid crystal molecules corresponding to the secondary sub-pixel 5, so that the light transmittance of the main sub-pixel 4 is greater than the light transmittance of the secondary sub-pixel 5.

Specifically, the first predetermined angle α ranges from 40 degrees to 50 degrees, and the second predetermined angle β ranges from 30 degrees to 45 degrees. Preferably, the first predetermined angle α is 45 degrees, so as to keep the deflection angle of the liquid crystal molecules corresponding to the main sub-pixel 4 to the maximum, thereby increasing the light transmittance of the main sub-pixel 4.

Specifically, each of the main sub-pixel 4 and the secondary sub-pixel 5 has four domains, that is, the main sub-pixel 4 includes a third trunk electrode 404 intersecting the first trunk electrode 402, and the secondary sub-pixel 5 further includes a fourth trunk electrode 504 intersecting the second trunk electrode 502. The first trunk electrode 402 and the third trunk electrode 404 divide the main sub-pixel 4 into four liquid crystal alignment areas, and the second trunk electrode 502 and the fourth trunk electrode 504 divide the secondary sub-pixel 5 into four liquid crystal alignment areas. The third trunk electrode 404 and the fourth trunk electrode 504 are vertical trunk electrodes, the third trunk electrode 404 and the first trunk electrode 402 cross each other, and the fourth trunk electrode 504 and the second trunk electrodes 502 cross each other.

Further, in other embodiments, the sub-pixel unit 3 of the pixel structure 100 is not limited to an 8-domain pixel design, but may also adopt a pixel design of more domains, such as a 12-domain pixel design. It should be noted that the pixel design of more domains means that the sub-pixel unit 3 includes one main sub-pixel 4, two or more secondary sub-pixels 5, and one thin film transistor 6 electrically connected to the main sub-pixel 4 and the two or more secondary sub-pixels 5.

Similarly, in order to obtain three or more voltage differences to improve the viewing angles, the present application also controls the second predetermined angle β between the second branch electrodes 503 and the corresponding ones of the second trunk electrodes 502 in different secondary sub-pixels 5 to be different to control the deflection angle of the liquid crystal molecules, so that a voltage difference is present between every two secondary sub-pixels 5 to obtain wider viewing angles.

Further, in an embodiment of the present application, when the second predetermined angle between the second branch electrode 503 and a corresponding one of the second trunk electrode 502 of the secondary sub-pixel 5 disposed close to the main sub-pixel 4 is β1, and the second predetermined angle between the second branch electrode 503 and the corresponding one of the second trunk electrode 502 of the secondary sub-pixel 5 disposed away from the main sub-pixel 4 is β2, it is necessary to ensure that β1 is greater than β2, so that the brightness of the sub-pixel unit 3 has a uniform transition.

Figure 3:
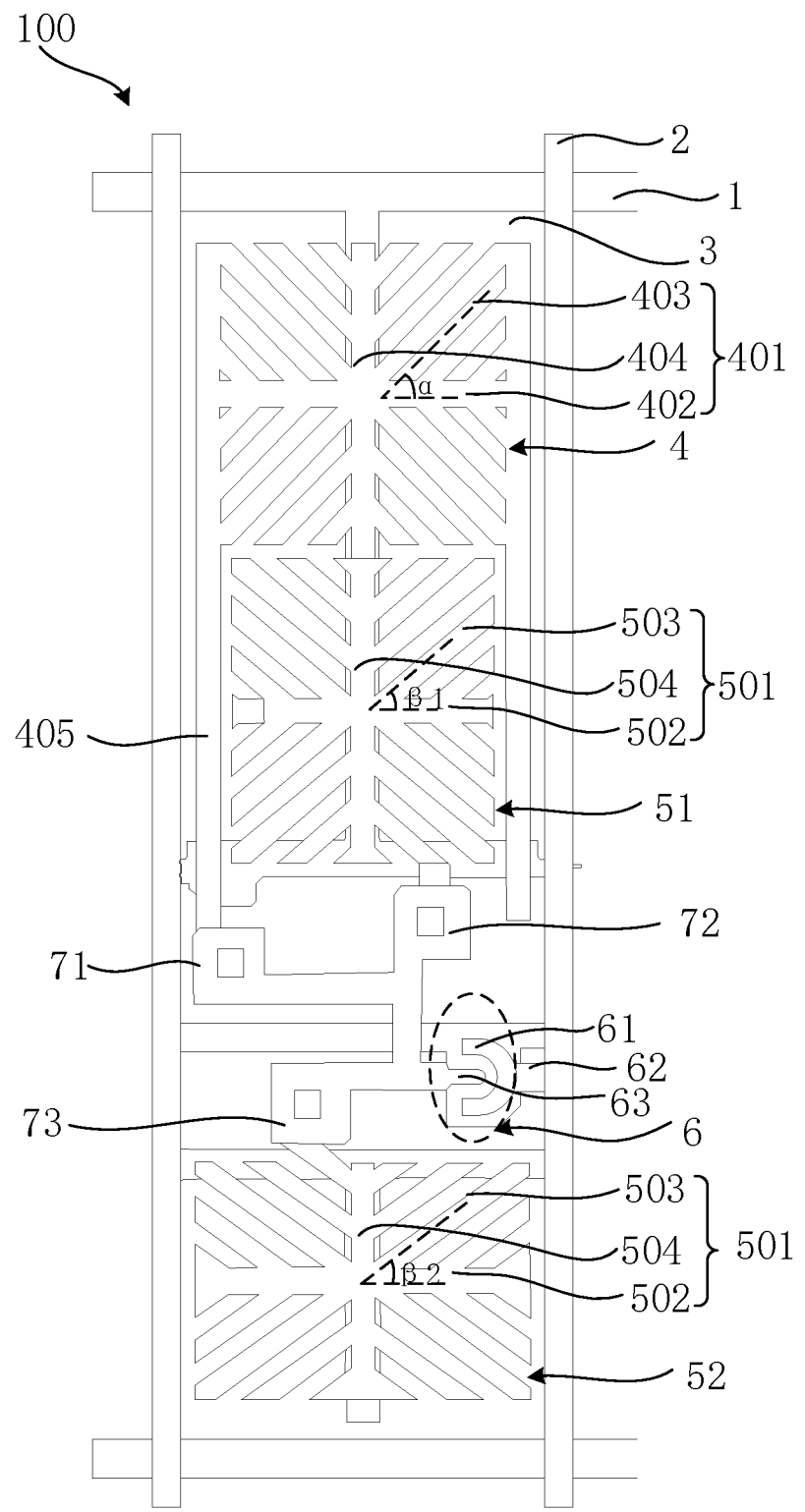
FIG. 3 is a schematic diagram of a plan structure of a second pixel structure provided by an embodiment of the present application.
Figure 4:
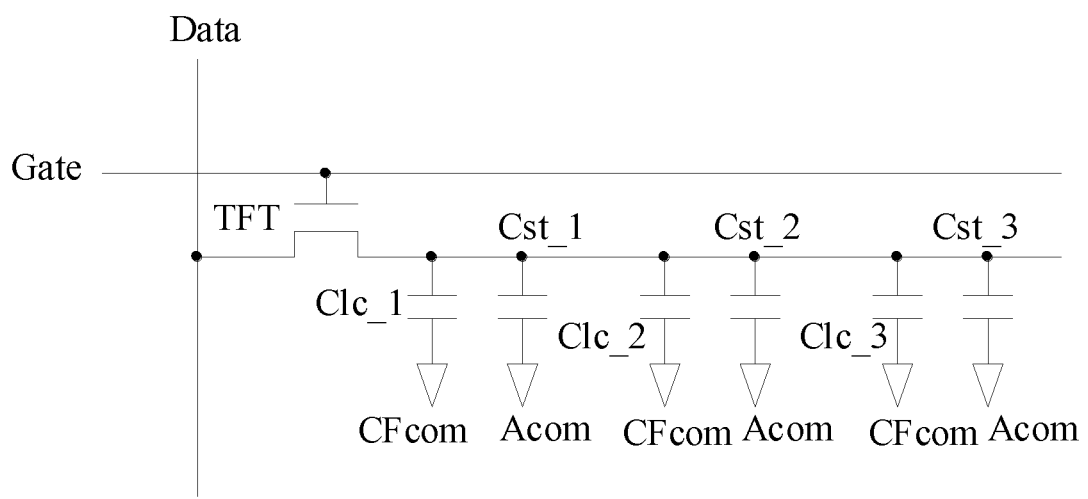
FIG. 4 is a circuit diagram corresponding to the second pixel structure shown in FIG. 2.

An embodiment of the present application takes a 12-domain pixel design as an example for illustrative purpose. Referring to FIG. 3 in conjugation with FIG. 4, the sub-pixel unit 3 of the pixel structure in an embodiment of the present application may adopt a twelve-domain pixel design. Specifically, each of the sub-pixel units 3 includes one main sub-pixel 4, two secondary sub-pixels 5, and one thin film transistor 6 electrically connected to the main sub-pixel 4 and the secondary sub-pixels 5.

The two secondary sub-pixels 5 include a first secondary sub-pixel 51 and a second secondary sub-pixel 52, each of the first secondary sub-pixel 51 and the second secondary sub-pixel 52 includes the sub-pixel electrodes 501, and the sub-pixel electrode 501 of each of the first secondary sub-pixel 51 and the second secondary sub-pixel 52 includes the second trunk electrode 502 and the second branch electrode 503. The thin film transistor 6 is electrically connected to the main sub-pixel 4, the first secondary sub-pixel 51, and the second secondary sub-pixel 52. Specifically, a second terminal 63 of the thin film transistor 6 is electrically connected to the main pixel electrode 401 through a first via hole 71, and the second terminal 63 of the thin film transistor 6 is electrically connected to the sub-pixel electrode 501 of the first secondary sub-pixel 51 through a second via hole 72, and the second terminal 63 of the thin film transistor 6 is electrically connected to the sub-pixel electrode 501 of the second secondary sub-pixel 52 through a third via hole 73.

In an embodiment of the present application, the thin film transistor 6 is provided between the first secondary sub-pixel 51 and the second secondary sub-pixel 52, an area of the main sub-pixel 4 is larger than an area of the first secondary sub-pixel 51, and the area of the first secondary sub-pixel 51 is larger than an area of the second secondary sub-pixel 52.

It is appreciated that since the main sub-pixel 4 is mainly used to control the brightness of the sub-pixel unit 3, the brightness of the main sub-pixel 4 is greater than the brightness of the first secondary sub-pixel 51 and the second secondary sub-pixel 52. Also, since the first secondary sub-pixel 51 is located closer to the main sub-pixel 4 than the second secondary sub-pixel 52, in order to achieve a uniform transition of the brightness of the main sub-pixels, the first secondary sub-pixel 51, and the second secondary sub-pixel 52, the brightness of the first secondary sub-pixel 51 is greater than the brightness of the second secondary sub-pixel 52. Therefore, in an embodiment of the present application, by setting the first predetermined angle α to be greater than the second predetermined angle β, and setting the second predetermined angle β1 between the second branch electrode 503 and a corresponding one of the second trunk electrode 502 of the secondary sub-pixel 5 disposed close to the main sub-pixel 4 to be greater than the second predetermined angle between the second branch electrode 503 and the corresponding one of the second trunk electrode 502 of the secondary sub-pixel 5 disposed away from the main sub-pixel 4 is β2, a deflection angle of the liquid crystal molecules corresponding to the main sub-pixel 4 is greater than a deflection angle of the liquid crystal molecules corresponding to the secondary sub-pixel 5, so that the light transmittance of the main sub-pixel 4 is greater than the light transmittance of the secondary sub-pixel 5, and a deflection angle of the liquid crystal molecules corresponding to the first secondary sub-pixel 51 is greater than a deflection angle of the liquid crystal molecules corresponding to the second secondary sub-pixel 52, so that the light transmittance of the main sub-pixel 4 is greater than the light transmittance of the first secondary sub-pixel 51, and the light transmittance of the first secondary sub-pixel 51 is greater than the light transmittance of the second secondary sub-pixel 52.

Specifically, the first predetermined angle α ranges from 40 degrees to 50 degrees, the second predetermined angle β between the second branch electrode 503 and the corresponding one of the second trunk electrode 502 of the first secondary sub-pixel 51 ranges from 30 degrees to 40 degrees, and the second predetermined angle β between the second branch electrode 503 and the corresponding one of the second trunk electrode 502 of the second secondary sub-pixel 52 ranges from 35 degrees to 45 degrees.

It is appreciated that the existing pixel design obtains a voltage difference between the main sub-pixel 4 and the first secondary sub-pixel 51 and the second secondary sub-pixel 52 by setting a shared electrode line (share bar). However, the pixel structure 100 provided by an embodiment of the present application can obtain the above-mentioned voltage difference without the shared electrode line, that is, the setting of the shared electrode line is eliminated, so that the aperture ratio can be further improved.

Further, the main sub-pixel 4 further includes a first storage capacitor Cst_1 and a first liquid crystal capacitor Clc_1, the first secondary sub-pixel 51 includes a second storage capacitor Cst_2 and a second liquid crystal capacitor Clc_2, and the second secondary sub-pixel 52 includes a second storage capacitor Cst_3 and a second liquid crystal capacitor Clc_3. The pixel structure 100 further includes a first common electrode Acom and a second common electrode CFcom. The first storage capacitor Cst_1 and the two second storage capacitors Cst_2 and Cst_3 are electrically connected to the first common electrode Acom; and the first liquid crystal capacitor Clc_1 and the two second liquid crystal capacitors Clc_2 and Clc_3 are electrically connected to the second common electrode CFcom.

Each of the main sub-pixel 4, the first secondary sub-pixel 51, and the second secondary sub-pixel 52 has four domains, that is, the main sub-pixel 4 includes a third trunk electrode intersecting the first trunk electrode 402, and each of the first secondary sub-pixel 51 and the second secondary sub-pixel 52 includes a fourth trunk electrode 504 intersecting the second trunk electrode 502. The first trunk electrode 402 and the third trunk electrode 404 divide the main sub-pixel 4 into four liquid crystal alignment areas, and the second trunk electrode 502 and the fourth trunk electrode 504 divide the corresponding first secondary sub-pixel 51 and the second secondary sub-pixel 52 into four liquid crystal alignment areas.

Specifically, the main pixel electrode 401 further includes two side electrodes 405, and the side electrodes 405 extend to opposite sides of the first secondary sub-pixel 51 and are located between the data lines 2 and the first secondary sub-pixel 51. On the one hand, the side electrodes 405 play a role of connecting the main pixel electrode 401 and the thin film transistor 6; and on the other hand, the two side electrodes 405 are symmetrically arranged on the opposite sides of the first secondary sub-pixel 51 to play a shielding role, thereby preventing interference with an electric field formed by the sub-pixel electrode 501 of the first secondary sub-pixel 51 and the second common electrode CFcom when the data line 2 is loaded with electrical signals.

Another embodiment of the present application also provides a display panel, which includes the pixel structure 100 in the foregoing embodiments.

Beneficial effects are that: in the pixel structure and the display panel provided by the present application, by only disposing one thin film transistor to electrically connect a main sub-pixel and at least one secondary sub-pixel, and by controlling a pretilt angle of the first branch electrode of the main sub-pixel to be different from a pretilt angle of the second branch electrodes of the secondary sub-pixel, a driving voltage of the main sub-pixel and a driving voltage of the secondary sub-pixel are different, so that color shift can be effectively alleviated and wider viewing angles can be obtained. Compared with the prior art, the present application only needs to use one thin film transistor to drive the main sub-pixel and at least one sub-sub pixel, which reduces a number of thin film transistors, greatly saves space, and is beneficial to improve an aperture ratio and light transmission of the pixel structure, thus reducing power consumption.

While the invention has been described by way of example and in terms of the preferred embodiments, it is to be appreciated that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A pixel structure, comprising a plurality of scan lines and a plurality of data lines crossing each other, wherein the plurality of scan lines and the plurality of data lines define a plurality of sub-pixel units, each of the plurality of sub-pixel units comprises a main sub-pixel, at least one secondary sub-pixel, and a thin film transistor electrically connecting the main sub-pixel and the at least one secondary sub-pixel;
wherein the main sub-pixel comprises a main pixel electrode, the main pixel electrode comprises a first trunk electrode and a first branch electrode, and the first branch electrode is electrically connected to the first trunk electrode at a first predetermined angle;
wherein each of the secondary sub-pixel comprises a sub-pixel electrode, the sub-pixel electrode comprises a second trunk electrode and a second branch electrode, and the second branch electrode is electrically connected to the second trunk electrode at a second predetermined angle; and
wherein the first predetermined angle is different from the second predetermined angle, the first predetermined angle is greater than the second predetermined angle, and each of the first predetermined angle and the second predetermined angle ranges from 30 degrees to 50 degrees;
wherein a control terminal of the thin film transistor is electrically connected to a corresponding one of the plurality of scan lines, a first terminal of the thin film transistor is electrically connected to a corresponding one of the plurality of data lines, and a second terminal of the thin film transistor is directly electrically connected to the main pixel electrode and the sub-pixel electrode, such that a driving voltage of the main sub-pixel and a driving voltage of the secondary sub-pixel are the same.

2. The pixel structure according to claim 1, wherein the second predetermined angle between the second branch electrode and a corresponding one of the second trunk electrode in different secondary sub-pixels is different.

3. The pixel structure according to claim 2, wherein the second predetermined angle between the second branch electrode and a corresponding one of the second trunk electrode of the secondary sub-pixel disposed close to the main sub-pixel is β1, and the second predetermined angle between the second branch electrode and a corresponding one of the second trunk electrode of the secondary sub-pixel disposed away from the main sub-pixel is β2; and
wherein β1 is greater than β2.

4. The pixel structure according to claim 1, wherein the first predetermined angle ranges from 40 degrees to 50 degrees, and the second predetermined angle ranges from 30 degrees to 45 degrees.

5. The pixel structure according to claim 1, wherein the main sub-pixel further comprises a first storage capacitor and a first liquid crystal capacitor, and each of the secondary sub-pixel further comprises a second storage capacitor and a second liquid crystal capacitor; and
wherein the pixel structure further comprises a first common electrode and a second common electrode; the first storage capacitor and the second storage capacitor are electrically connected to the first common electrode; the first liquid crystal capacitor is electrically connected to the second common electrode; and the first liquid crystal capacitor is electrically connected to the second common electrode.

6. The pixel structure according to claim 1, wherein the at least one secondary sub-pixel comprises a first secondary sub-pixel and a second secondary sub-pixel; the thin film transistor is electrically connected to the main sub-pixel, the first secondary sub-pixel, and the second secondary sub-pixel; and the thin film transistor is located between the first secondary sub-pixel and the second secondary sub-pixel; and
wherein the first predetermined angle is greater than the second predetermined angle, and the second predetermined angle between the second branch electrode and a corresponding one of the second trunk electrode of the first secondary sub-pixel is greater than the second predetermined angle between the second branch electrode and a corresponding one of the second trunk electrode of the second secondary sub-pixel.

7. The pixel structure according to claim 6, wherein the first predetermined angle ranges from 40 degrees to 50 degrees, the second predetermined angle between the second branch electrode and the corresponding one of the second trunk electrode of the first secondary sub-pixel ranges from 30 degrees to 40 degrees, and the second predetermined angle between the second branch electrode and the corresponding one of the second trunk electrode of the second secondary sub-pixel ranges from 35 degrees to 45 degrees.

8. A pixel structure, comprising a plurality of scan lines and a plurality of data lines crossing each other, wherein the plurality of scan lines and the plurality of data lines define a plurality of sub-pixel units, each of the plurality of sub-pixel units comprises a main sub-pixel, at least one secondary sub-pixel, and a thin film transistor electrically connecting the main sub-pixel and the at least one secondary sub-pixel;
wherein the main sub-pixel comprises a main pixel electrode, the main pixel electrode comprises a first trunk electrode and a first branch electrode, and the first branch electrode is electrically connected to the first trunk electrode at a first predetermined angle;
wherein each of the secondary sub-pixel comprises a sub-pixel electrode, the sub-pixel electrode comprises a second trunk electrode and a second branch electrode, and the second branch electrode is electrically connected to the second trunk electrode at a second predetermined angle;
wherein the first predetermined angle is different from the second predetermined angle; and
wherein the first predetermined angle is greater than the second predetermined angle, and the first predetermined angle ranges from 30 degrees to 50 degrees;
wherein a control terminal of the thin film transistor is electrically connected to a corresponding one of the plurality of scan lines, a first terminal of the thin film transistor is electrically connected to a corresponding one of the plurality of data lines, and a second terminal of the thin film transistor is directly electrically connected to the main pixel electrode and the sub-pixel electrode, such that a driving voltage of the main sub-pixel and a driving voltage of the secondary sub-pixel are the same.

9. The pixel structure according to claim 8, wherein the second predetermined angle between the second branch electrode and a corresponding one of the second trunk electrode in different secondary sub-pixels is different.

10. The pixel structure according to claim 9, wherein the second predetermined angle between the second branch electrode and a corresponding one of the second trunk electrode of the secondary sub-pixel disposed close to the main sub-pixel is β1, and the second predetermined angle between the second branch electrode and a corresponding one of the second trunk electrode of the secondary sub-pixel disposed away from the main sub-pixel is β2; and
wherein β1 is greater than β2.

11. The pixel structure according to claim 8, wherein the second predetermined angle ranges from 30 degrees to 50 degrees.

12. The pixel structure according to claim 8, wherein the first predetermined angle ranges from 40 degrees to 50 degrees, and the second predetermined angle ranges from 30 degrees to 45 degrees.

13. The pixel structure according to claim 8, wherein the main sub-pixel further comprises a first storage capacitor and a first liquid crystal capacitor, and each of the secondary sub-pixel further comprises a second storage capacitor and a second liquid crystal capacitor; and
wherein the pixel structure further comprises a first common electrode and a second common electrode; the first storage capacitor and the second storage capacitor are electrically connected to the first common electrode; the first liquid crystal capacitor is electrically connected to the second common electrode; and the first liquid crystal capacitor is electrically connected to the second common electrode.

14. The pixel structure according to claim 8, wherein the at least one secondary sub-pixel comprises a first secondary sub-pixel and a second secondary sub-pixel; the thin film transistor is electrically connected to the main sub-pixel, the first secondary sub-pixel, and the second secondary sub-pixel; and the thin film transistor is located between the first secondary sub-pixel and the second secondary sub-pixel; and
wherein the first predetermined angle is greater than the second predetermined angle, and the second predetermined angle between the second branch electrode and a corresponding one of the second trunk electrode of the first secondary sub-pixel is greater than the second predetermined angle between the second branch electrode and a corresponding one of the second trunk electrode of the second secondary sub-pixel.

15. The pixel structure according to claim 14, wherein the first predetermined angle ranges from 40 degrees to 50 degrees, the second predetermined angle between the second branch electrode and the corresponding one of the second trunk electrode of the first secondary sub-pixel ranges from 30 degrees to 40 degrees, and the second predetermined angle between the second branch electrode and the corresponding one of the second trunk electrode of the second secondary sub-pixel ranges from 35 degrees to 45 degrees.

16. The pixel structure according to claim 8, wherein the main sub-pixel further comprises a third trunk electrode intersecting the first trunk electrode, and each of the secondary sub-pixel further comprises a fourth trunk electrode intersecting the second trunk electrode; and
wherein the first trunk electrode and the third trunk electrode divide the main sub-pixel into four liquid crystal alignment areas, and the second trunk electrode and the fourth trunk electrode divide each of the secondary sub-pixel into four liquid crystal alignment areas.

17. A display panel, comprising a pixel structure, the pixel structure comprising a plurality of scan lines and a plurality of data lines crossing each other, wherein the plurality of scan lines and the plurality of data lines define a plurality of sub-pixel units, each of the plurality of sub-pixel units comprises a main sub-pixel, at least one secondary sub-pixel, and a thin film transistor electrically connecting the main sub-pixel and the at least one secondary sub-pixel;
wherein the main sub-pixel comprises a main pixel electrode, the main pixel electrode comprises a first trunk electrode and a first branch electrode, and the first branch electrode is electrically connected to the first trunk electrode at a first predetermined angle;
wherein each of the secondary sub-pixel comprises a sub-pixel electrode, the sub-pixel electrode comprises a second trunk electrode and a second branch electrode, and the second branch electrode is electrically connected to the second trunk electrode at a second predetermined angle;
wherein the first predetermined angle is different from the second predetermined angle; and
wherein the first predetermined angle is greater than the second predetermined angle, each of the first predetermined angle and the second predetermined angle ranges from 30 degrees to 50 degrees;
wherein a control terminal of the thin film transistor is electrically connected to a corresponding one of the plurality of scan lines, a first terminal of the thin film transistor is electrically connected to a corresponding one of the plurality of data lines, and a second terminal of the thin film transistor is directly electrically connected to the main pixel electrode and the sub-pixel electrode, such that a driving voltage of the main sub-pixel and a driving voltage of the secondary sub-pixel are the same.

* * * * *